(12) United States Patent
Morand

(10) Patent No.: US 7,053,404 B2
(45) Date of Patent: *May 30, 2006

(54) ACTIVE SEMICONDUCTOR COMPONENT WITH AN OPTIMIZED SURFACE AREA

(75) Inventor: Jean-Luc Morand, Tours (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

This patent is subject to a terminal disclaimer.

(21) Appl. No.: 10/763,579

(22) Filed: Jan. 22, 2004

(65) Prior Publication Data

US 2005/0121732 A1 Jun. 9, 2005

(30) Foreign Application Priority Data

Dec. 5, 2003 (FR) .................................. 03 50987

(51) Int. Cl.
*H01L 29/40* (2006.01)
*H01L 29/88* (2006.01)

(52) U.S. Cl. .......................... 257/46; 257/104; 257/121

(58) Field of Classification Search .................. 257/46, 257/104, 106, 109, 121, 161, 199, 481, 551, 257/601, 603

See application file for complete search history.

(56) References Cited

U.S. PATENT DOCUMENTS

| 3,069,603 | A | | 12/1962 | Hunter |
| 3,128,530 | A | | 4/1964 | Rouse et al. |
| 3,254,275 | A | | 5/1966 | Lob |
| 3,411,054 | A | | 11/1968 | Cullis |
| 3,925,803 | A | * | 12/1975 | Kobayashi .................. 257/266 |
| 3,988,764 | A | | 10/1976 | Cline et al. |
| 4,032,955 | A | | 6/1977 | Anthony et al. |

FOREIGN PATENT DOCUMENTS

WO   WO 00/35018   6/2002

OTHER PUBLICATIONS

French Search Report from corresponding French National Application No. 03/50987 filed Dec. 5, 2003.
French Search Report from related French National Application No. 03/50985 filed Dec. 5, 2003.
Zhong J.X. et al., *Electronic Structure of a Fractal Model of Porous Silicon*, J. Non-Cryst. Solids (Netherlands), Dec. 1993, vol. 164-166, Pt. 2, pp. 969-972, XP002290027.

* cited by examiner

*Primary Examiner*—Hoai Pham
(74) *Attorney, Agent, or Firm*—Lisa K. Jorgenson; James H. Morris; Wolf, Greenfield & Sacks, P.C.

(57) ABSTRACT

A semiconductor component in which the active junctions extend along at least one cylinder perpendicular to the main surfaces of a semiconductor chip substantially across the entire thickness thereof, said cylinder(s) having a cross-section with an undulated closed curve shape.

41 Claims, 7 Drawing Sheets

ACTIVE SEMICONDUCTOR COMPONENT WITH AN OPTIMIZED SURFACE AREA

BACKGROUND OF THE INVENTION

1. Field of the Invention

The present invention relates to a novel type of MOS-type semiconductor power component, this component being generally called a discrete component although several such components may be provided on the same chip, and/or they can be associated with logic circuits provided on the same chip.

2. Discussion of the Related Art

FIGS. 1A and 1B show, as an example, a perspective view and a cross-section view of a conventional vertical power diode. This diode is formed from a substrate comprising a heavily-doped N-type region 1 ($N^+$) and a lightly-doped N-type region 2 coated with a P-type layer 3. The upper surface is coated with an anode metallization 4 and the lower surface is coated with a cathode metallization 5. Reference numeral 6 designates an insulating layer.

FIG. 2 is a perspective view of a vertical power thyristor. The thyristor includes a lightly-doped N-type substrate 10. On the upper surface side is formed a P-type well 11 containing an N-type cathode region 12. On the lower surface side is formed a P-type anode layer 13. An anode metallization MA, a cathode metallization MK, and a gate metallization MG are also provided. To avoid for the anode metallization to short-circuit substrate 10, or to separate this thyristor from a neighboring component, a peripheral P-type insulating wall 15 is generally provided.

A disadvantage of vertical components is their on-state resistance. Indeed, the thicknesses of the various layers and regions are optimized according to the desired diode characteristics. In particular, the thickness of N-type layer 2 (diode) or 10 (thyristor) must be sufficiently high for the component to have a desired breakdown voltage but must also be as small as possible to limit the on-state resistance of the component. In the case of a diode, $N^+$ layer 1 has no active function in the diode operation. It is only used to ensure an ohmic contact with the metallization and is used to reduce the diode's on-state resistance linked to the fact that a silicon wafer has, in current technologies, a thickness of from 300 to 500 µm, in most cases much greater than the desired thickness of N layer 2 (for example, 60 µm to hold 600 V). In the case of the thyristor, the thickness of layer 10 is also imposed by the thickness of the silicon wafer and various means, often complex, are used to reduce it.

Another disadvantage of vertical components is that the surface area of the active junctions is linked to the surface area of the semiconductor chip taken up by the components, the junctions being horizontal (in planes parallel to the main diode surfaces).

Further, such components intended to handle high voltages pose many problems to ensure a proper breakdown voltage at the periphery of the semiconductor or Schottky junction, as well as to isolate the entire component and ensure its protection (insulating wall).

A $PNN^+$ diode and a thyristor have been described as an example only, the problems indicated hereabove generally relating to vertical power or high-voltage components, for example, Schottky diodes, bi-directional components, or MOS-type voltage-controlled components.

SUMMARY OF THE INVENTION

The present invention aims at providing novel types of diodes, and more generally novel types of semiconductor power or high-voltage components enabling avoiding at least some of the above-mentioned disadvantages of vertical components, in particular increasing the active junction surface area with respect to the surface area of the chip in which the component is formed, reducing the on-state voltage drop, and simplifying the peripheral structure of the individual components.

To achieve these and other objects, the present invention provides a semiconductor component in which the active junctions extend along at least one cylinder perpendicular to the main surfaces of a semiconductor chip substantially across the entire thickness thereof, said cylinder(s) having a cross-section with an undulated closed curve shape.

According to an embodiment of the present invention, said undulated curve is a curve of Sierpinksi curve type.

According to an embodiment of the present invention, the contacts with regions to be connected are taken by conductive fingers perpendicular to the main surfaces of the semiconductor chip and substantially crossing the entire region with which a contact is desired to be established.

According to an embodiment of the present invention, the conductive fingers are metal fingers.

According to an embodiment of the present invention, the semiconductor component is of multicellular type, and the junctions are formed of several cylinders perpendicular to the main substrate surfaces.

According to an embodiment of the present invention, said at least one conductive finger solid with the most external semiconductor layer forms a cylinder or cylinder portions surrounding said most external semiconductor layer.

According to an embodiment of the present invention, the component is a diode comprising a central conductive finger extending across the entire substrate thickness surrounded with a region of a first conductivity type and with a region of a second conductivity type, a contact being taken back at the periphery of the region of the second conductivity type by at least one peripheral conductive finger, the central conductive finger being connected to a first metallization extending over an entire substrate surface, and said at least one peripheral conductive finger being connected to a metallization on the other substrate surface.

According to an embodiment of the present invention, the diode is formed in an N-type semiconductor substrate, the conductive fingers penetrating into the N-type regions being surrounded with heavily-doped N-type regions.

According to an embodiment of the present invention, the component is a bipolar transistor, alternately comprising a region of a first conductivity type, a region of a second conductivity type, and a region of the first conductivity type, each of these regions extending across the entire substrate thickness and being in contact with at least one conductive finger, each of the conductive fingers being respectively connected to an emitter metallization, to a base metallization, and to a collector metallization.

According to an embodiment of the present invention, the component is a thyristor successively comprising a first region of a first conductivity type, a second region of the second conductivity type, a third region of the first conductivity type, and a fourth region of the second conductivity type, each of these regions extending across the entire substrate thickness, a conductive finger extending into the entire first region, at least one conductive finger extending into the entire second region, and at least one conductive finger extending into the entire fourth region.

According to an embodiment of the present invention, in the thyristor, the first conductivity type is type N, the second conductivity type is type P, the first region being a cathode region and the fourth region an anode region, and localized metallizations extend vertically between the gate region and the cathode region to form localized gate-cathode short-circuits.

The foregoing objects, features, and advantages of the present invention will be discussed in detail in the following non-limiting description of specific embodiments in connection with the accompanying drawings.

DETAILED DESCRIPTION

As conventional in the field of semiconductor representation, the various drawings are not to scale. Especially, in the various drawings, the lateral dimensions have been greatly exaggerated with respect to the vertical directions. Indeed, a silicon wafer currently has a thickness of from 300 to 500 μm—and greater thicknesses may be chosen for an implementation of the present invention—while patterns and vias may be defined according to dimensions on the order of from 1 to 10 μm, or more.

Figure 1A:
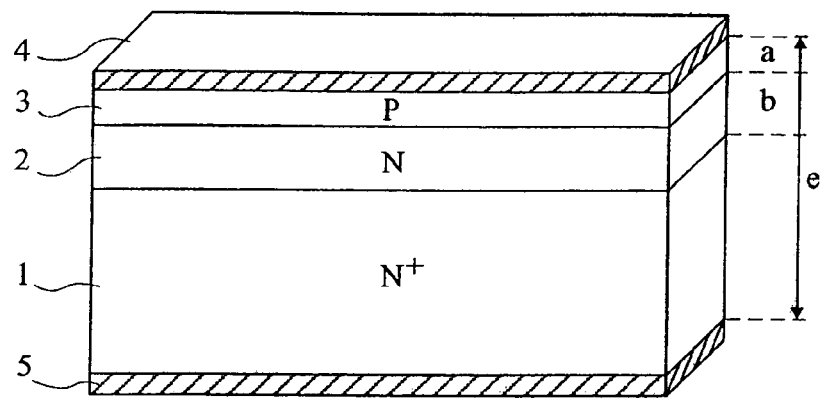
FIGS. 1A and 1B, previously described, are simplified perspective and cross-section views of a conventional vertical diode structure.
Figure 1B:
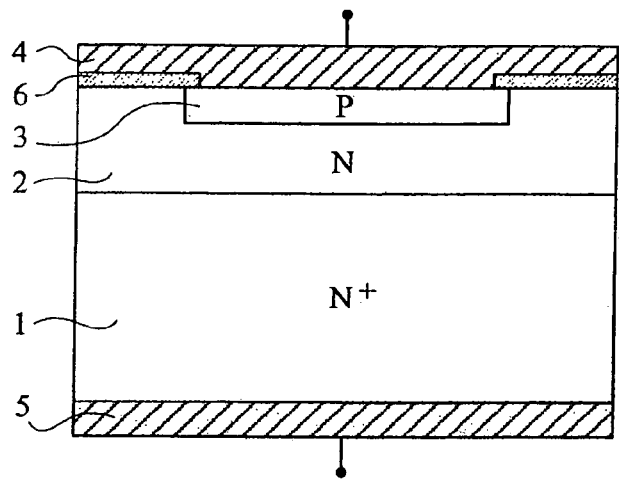
Figure 2:
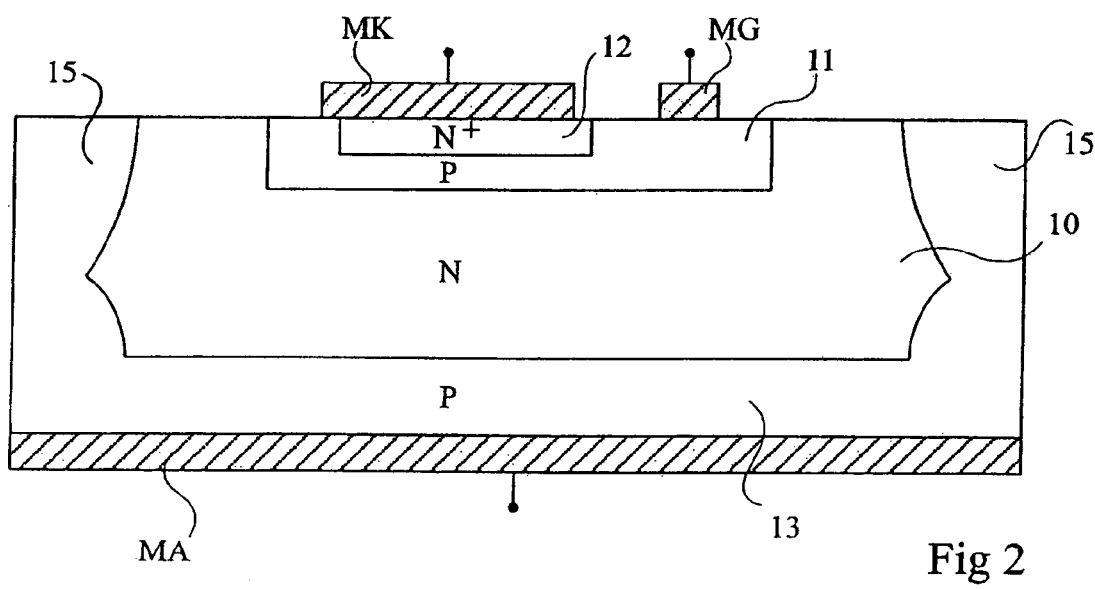
FIG. 2, previously described, is a simplified cross-section view of a conventional vertical thyristor structure.
Figure 3A:
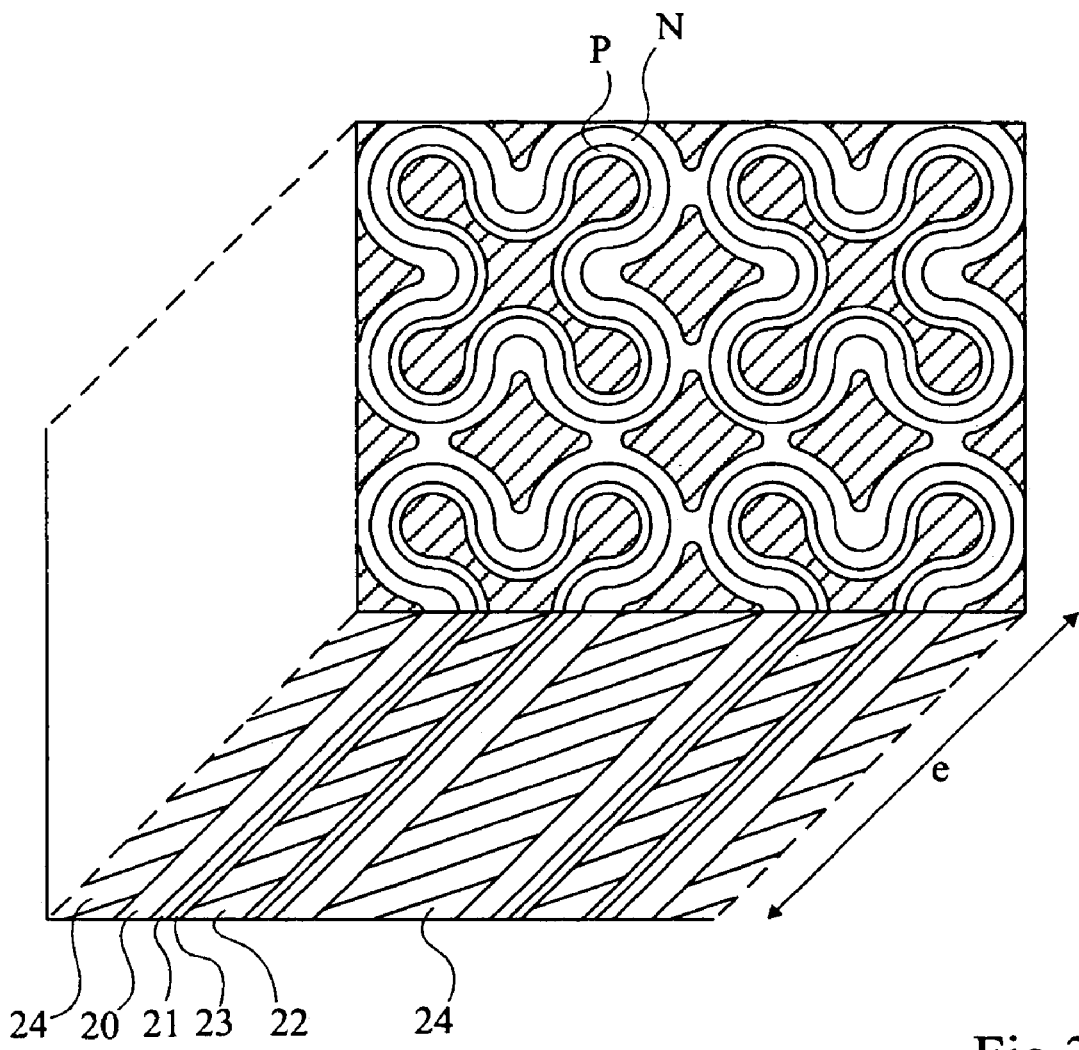
FIG. 3A is a simplified perspective view of an embodiment of a diode according to the present invention.

FIG. 3A is a simplified perspective view of a portion of a semiconductor component in which is formed an assembly of diode cells according to the present invention. The main component surfaces correspond to the upper and lower surfaces of a semiconductor wafer, and the vertical surface, the thickness of which is designated as e, corresponds to the thickness of the semiconductor wafer.

The junction of each diode cell is formed vertically across the thickness of the semiconductor wafer.

FIG. 3A shows a topology of a multicellular diode according to the present invention, it being understood that in certain cases, a single diode cell may be used. The structure is formed in a lightly-doped N-type substrate 21, the thickness of which is designated as e. Each cell comprises a central cylindrical conductive finger 22 surrounded with a P-type cylindrical region 23, itself surrounded with an N-type cylindrical substrate portion 21. Contacts are taken with substrate portion 21 by conductive fingers 24. The entire the volume 20 between cylindrical portion 21 and conductive fingers 24 could be taken up by metal. Only in the context of an embodiment of the present invention will fingers 24 be here mainly described as separated from one another.

A way to form such a structure is to form from a wafer surface first openings 22 preferably extending along the entire height e of the substrate. From these openings is formed a P-type diffusion 23, after which the openings are filled with metal to form vias 22. Second openings 24, in quincunx with respect to openings 22, also extend preferably along the entire substrate height. A short $N^+$ diffusion 25 is formed from the second openings which are filled with metal to form vias 24. All vias 22 are interconnected and all vias 24 are interconnected by anode and cathode metallizations, not shown, with insulating layers, not shown, ensuring the necessary insulations. A diode with vertical junctions having a low on-state resistance and a density much greater than what could be obtained with a conventional diode with a horizontal junction is obtained between these metallizations, for example, respectively formed on the upper and lower structure surfaces.

Thus, the diode junction is a vertical junction between N and P regions 21 and 23. It is not necessary, as in the case of conventional diodes, to provide a thick $N^+$ region on the rear surface side. Thus, the on-state voltage drop in the diode is reduced.

According to an aspect of the present invention, the contour of the section of each cylinder corresponds to a fractal curve and more specifically to a curve of Sierpinski type, which will be called hereafter, to simplify and generalize, an "undulated curve". This enables increasing the junction surface area for a given chip surface area.

Figure 3B:
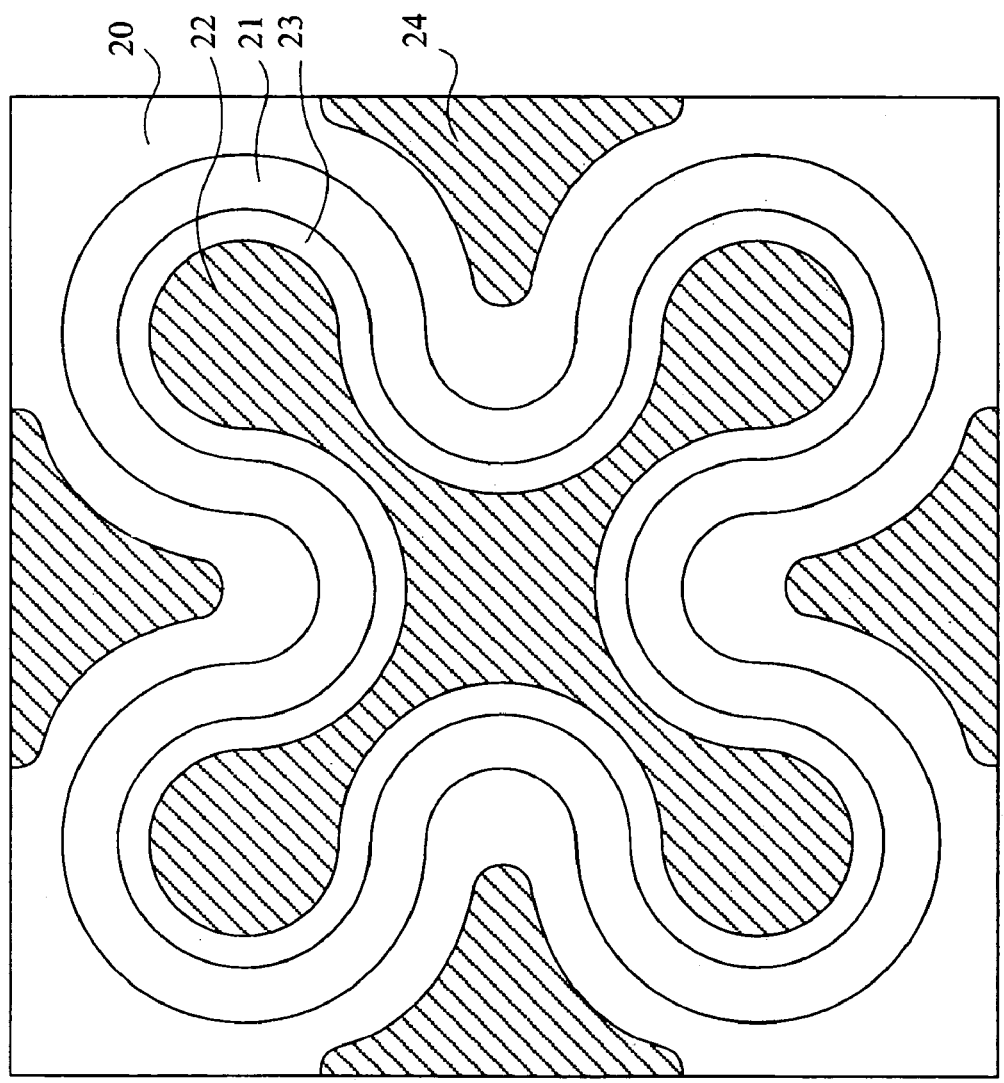
FIG. 3B is a simplified top view of an embodiment of a diode cell according to the present invention.

FIG. 3B is an enlarged top view of a pattern of FIG. 3A.

Figure 3C:
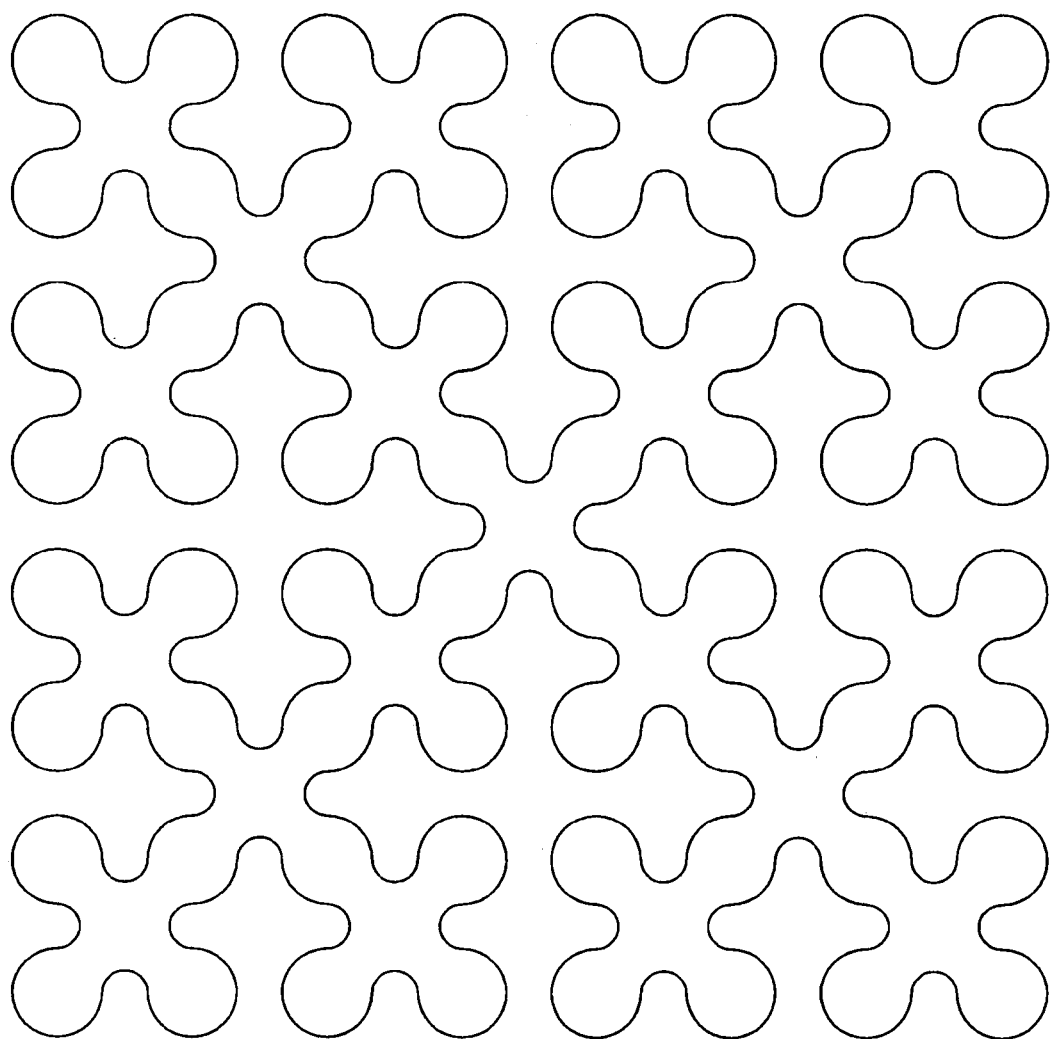
FIG. 3C is a simplified top view of an alternative diode according to the present invention.

FIG. 3C shows slightly modified fractal Sierpinski curves, which further increase the junction surface area.

Figure 4:
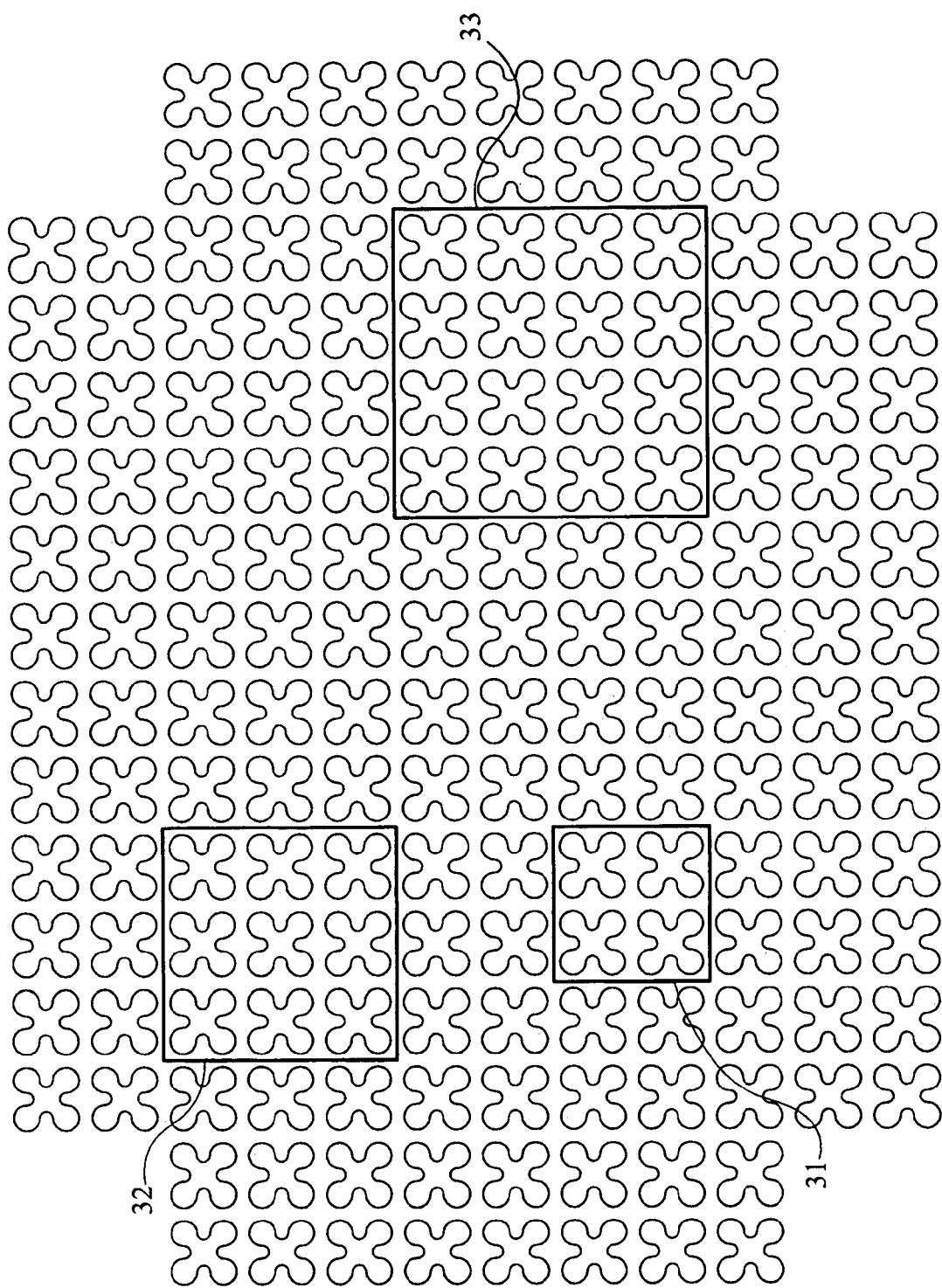
FIG. 4 is a simplified top view of a sea of diode cells according to the present invention.

FIG. 4 is a top view of a silicon wafer in which have been formed a large number of vertical cylinders having a cross section with an undulated curve shape such as those in FIG. 3B forming a diode cell sea. Different power diodes (that can conduct greater or smaller currents) may be formed by choosing to cut the wafer according to 4 elementary patterns (block 31), according to 9 elementary patterns (block 32), or according to 16 elementary patterns or more (block 33). Cuttings according to rectangular contours may also be chosen. This has the advantage that, by providing silicon wafers of same structure, diodes of different power can be obtained according to the cutting, whereby stocks and production lines are decreased.

It should also be noted that fractal curves enable good balance of the anode-cathode surface areas. Further, their shape coefficient enables etching a cylinder within much shorter times than in the case of cylinders with a circular cross-section.

It should be noted that, instead of providing simple conductive fingers 24, metal could be present all around useful N-type areas 21. The structure can then be seen as a conductive (metal) plate comprising openings containing concentric cylindrical elements comprising a central via 22, surrounded with a P-type semiconductor cylinder 23, surrounded with an N-type semiconductor cylinder 21, possibly surrounded with an $N^+$ semiconductor cylinder.

The above description essentially aims at the diode structure and the order of the manufacturing steps may be modified.

Figure 5A:
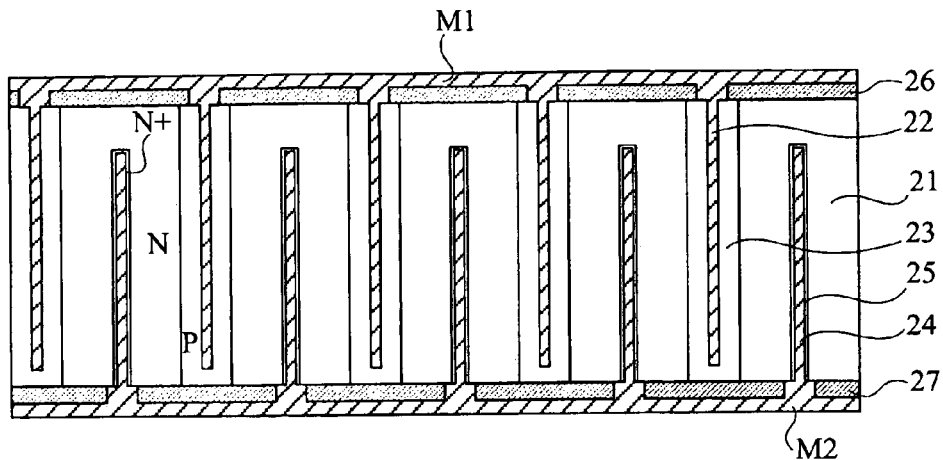
FIGS. 5A and 5B respectively are a simplified cross-section view and a circuit diagram of a diode according to the present invention.

FIG. 5A shows a more detailed cross-section view of a structure such as that in FIG. 3. Same elements as in FIG. 3 are designated with same reference numerals. Reference numerals 26 and 27 designate insulating layers. Insulating layer 26 on the upper substrate surface covers all the N regions and insulating layer 27 on the lower substrate surface covers all the P regions. An upper surface metallization M1 is in contact with all vias 22 in contact with P-type regions 23 and a lower surface metallization M2 is in contact with all vias 24 in contact with N$^+$-type regions 25, themselves in contact with portions of N substrate 21.

In the example of FIG. 5A, the upper layer vias have been shown as substantially through vias and the lower layer vias have been shown as non-through vias. However, other options may be chosen according to the selected manufacturing technologies.

Figure 5B:
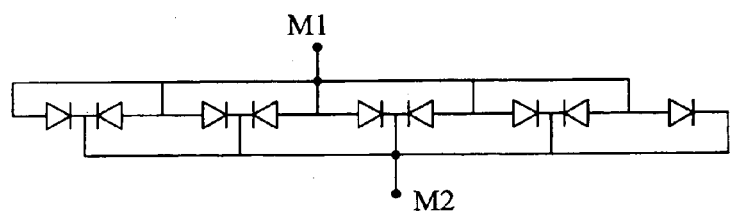

FIG. 5B shows the equivalent diagram of the structure of FIG. 5A between metallizations M1 and M2. According to an advantage of the present invention, the junction surface area of the assembly of diode cells in parallel may be much greater than the surface area of the chip containing these diode cells. Another advantage of this type of manufacturing is that it is possible to form several components according to the present invention on a same wafer, each of these components being easily surroundable with an insulating wall formed in any known fashion.

The diode structure according to the present invention is well adapted to the forming of various diode assemblies, for example, series, rectifying bridge, bi-directional avalanche diode, or antiparallel assemblies. Such assemblies may be formed by connecting each of the diode contacts to a metallization on the upper or lower surface side and possibly by providing several metallization levels as well as insulating walls between diodes 59.

In the various drawings, the fingers are illustrated as through or not fingers. This depends on the embodiments and on the selected manufacturing technologies. In the case of through fingers, their end not connected to a contact is isolated.

Figure 6:
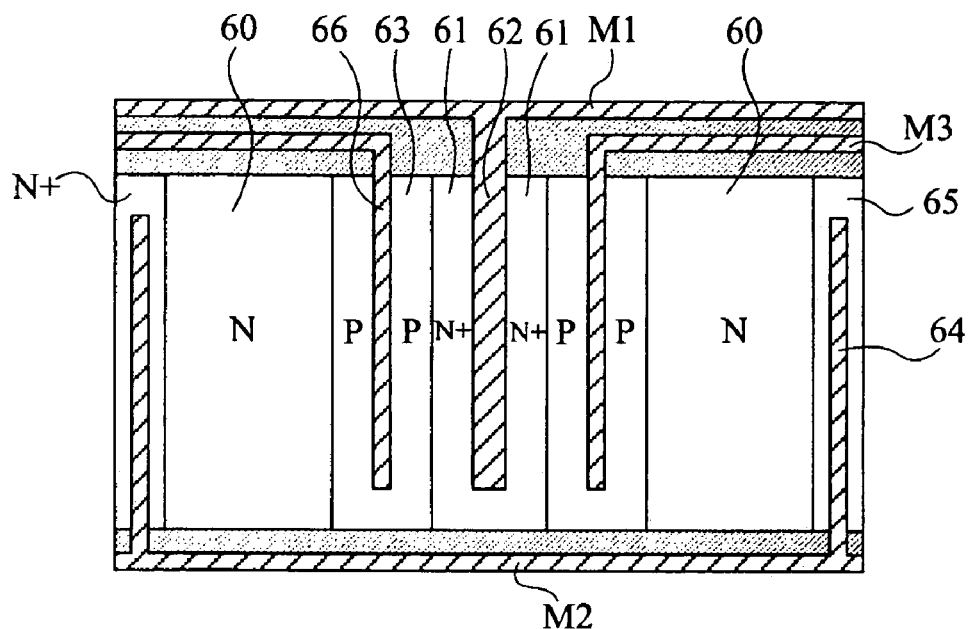
FIG. 6 is a cross-section view of a bipolar transistor according to the present invention.

FIG. 6 is a cross-section view of an embodiment according to the present invention of a bipolar transistor. The bipolar transistor is formed in an N-type substrate 60 and comprises a heavily-doped N-type emitter region 61 around a central conductive finger 62 extending across all or substantially all the substrate thickness. A P-type base region 63 is arranged around the emitter between the emitter and a collector region corresponding to substrate 60. Conductive fingers 64 starting from the lower surface are surrounded with N$^+$ regions 65 and are used as a collector contact. An intermediary metallization M3 on the upper surface side is solid with conductive fingers 66 contacting base region 63. Conductive fingers 66 are spaced apart in a grid to enable proper operation of the base. Fingers 64 may form a conductive cylinder completely surrounding the shown transistor cell.

Figure 7:
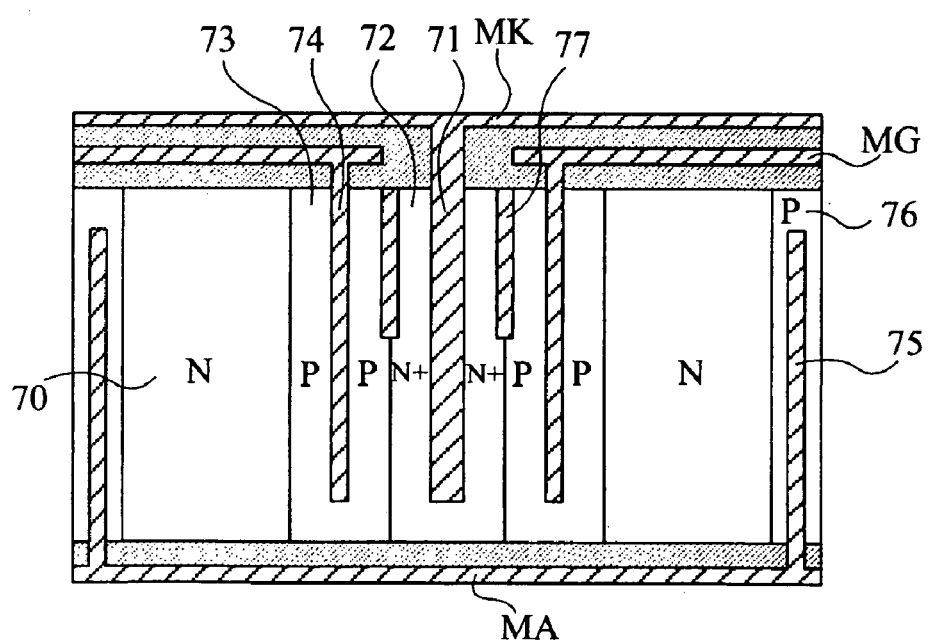
FIG. 7 is a cross-section view of a thyristor according to the present invention.

FIG. 7 is a cross-section view of a thyristor structure. The structure is formed in an N-type semiconductor substrate 70. In a central region, a conductive finger 71 is surrounded with a heavily-doped N-type region 72 corresponding to the thyristor cathode and with a P layer 73. These regions may be formed by successively diffusing, from a through or substantially through opening, a P dopant, followed by an N dopant, or by simultaneously diffusing dopants having properly different diffusion rates. Finger 71 is connected to a cathode metallization MK. Conductive fingers 74 penetrate into P-type region 73 and form gate contact points solid with a gate metallization MG. On the lower surface side, at the component periphery, are formed conductive fingers 75 surrounded with a P-type region 76 that forms the thyristor anode and which is connected by fingers 75 to an anode metallization MA. It should be noted that, as conventional in a thyristor, localized gate-cathode short-circuits may be formed by means of conductive fingers 77 only partially penetrating into the substrate between N region 72 and P region 74. Insulating regions, with no reference numerals, are intended to separate the various metallizations and to insulate the appropriate areas. The entire structure may be surrounded with an insulating wall.

A triac may be formed by assembling two thyristors of the above type in parallel and an in opposition.

The various illustrated structures are likely to have various alterations and modifications, and those skilled in the art should note that the alterations described for certain embodiments apply to other embodiments.

In the same way as a sea of diode cells has been illustrated in FIG. 4, thyristors or multicellular transistors may be formed by repeating a pattern. Similarly, many component associations may simply be formed in a same substrate, separated or not by insulating walls.

On the other hand, many embodiments will readily occur to those skilled in the art, and will be possible according to the technical development, the forming of conductive fingers or of plates formed in trenches only being examples of possible approaches of the forming of the described structures with vertical junctions.

It should be noted that, since a greater density of components is obtained with vertical junction components according to the present invention than with conventional horizontal junction components, more heat will be generated per surface area unit when the components are on (although the on-state voltage drop is smaller due to the possible optimization of the thickness of the reverse voltage strength layer). However, this heat may advantageously be extracted by means of the through conductive fingers. Indeed, metal fingers have a heat conductivity from 2 to 3.5 times greater than the equivalent silicon volume. These fingers may take up a large surface area and, in particular, the peripheral "fingers" may take up the entire free surface area between elementary cells of a component.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A semiconductor component in which active junctions extend along at least one cylinder perpendicular to main surfaces of a semiconductor chip substantially across an entire thickness thereof, said at least one cylinder having a cross-section with a regularly undulated closed curve shape.

2. The semiconductor component of claim 1, wherein said undulated curve is a curve of Sierpinksi curve type.

3. The semiconductor component of claim 1, wherein contacts with regions to be connected are made by conductive fingers perpendicular to the main surfaces of the semiconductor chip and substantially crossing an entire region with which a contact is desired to be established.

4. The semiconductor component of claim 3, wherein the conductive fingers are metal fingers.

5. The semiconductor component of claim 3, wherein at least one of the conductive fingers is solid, wherein at least a portion of at least one of the conductive fingers contacts a most external semiconductor layer.

6. The semiconductor component of claim 1, wherein the semiconductor component is of multicellular type, and the junctions are formed of several cylinders perpendicular to the main substrate surfaces.

7. A diode according to claim 6, formed in an N-type semiconductor substrate, wherein the conductive fingers penetrating into the N-type regions are surrounded with heavily-doped N-type regions.

8. The thyristor of claim 7, wherein the first conductivity type is type N, the second conductivity type is type P, the first region being a cathode region and the fourth region an anode region, and wherein localized metallizations extend vertically between the gate region and the cathode region to form localized gate-cathode short-circuits.

9. A diode according to claim 1, comprising a central conductive finger extending across the entire substrate thickness surrounded with a region of a first conductivity type and with a region of a second conductivity type, a contact being taken back at the periphery of the region of the second conductivity type by at least one peripheral conductive finger, the central conductive finger being connected to a first metallization extending over an entire substrate surface, and said at least one peripheral conductive finger being connected to a metallization on the other substrate surface.

10. A bipolar transistor according to claim 1, alternately comprising a region of a first conductivity type, a region of a second conductivity type, and a region of the first conductivity type, each of these regions extending across the entire substrate thickness and being in contact by at least one conductive finger, each of the conductive fingers being respectively connected to an emitter metallization, to a base metallization, and to a collector metallization.

11. A thyristor according to claim 1, successively comprising a first region of a first conductivity type, a second region of the second conductivity type, a third region of the first conductivity type, and a fourth region of the second conductivity type, each of these regions extending across the entire substrate thickness, a conductive finger extending into the entire first region, at least one conductive finger extending into the entire second region, and at least one conductive finger extending into the entire fourth region.

12. A semiconductor component, comprising:
a substrate;
a first region of a first conductivity type;
a second region of a second conductivity type; and
a p-n junction between the first region and the second region along a surface that extends through the substrate, wherein the surface has a cross section with a wavy shape.

13. The semiconductor component of claim 12, wherein at least a portion of the wavy shape is a fractal curve.

14. The semiconductor component of claim 13, wherein the portion is a curve of Sierpinksi curve type.

15. The semiconductor component of claim 12, wherein the wavy shape comprises regularly spaced lobes.

16. The semiconductor component of claim 12, wherein the wavy shape has a clover-like shape.

17. The semiconductor component of claim 12, further comprising:
a first contact that extends through the substrate and contacts the first region; and
a second contact that extends through the substrate.

18. The semiconductor component of claim 17, wherein the first contact and the second contact are metal contacts.

19. The semiconductor component of claim 17, wherein the first region of the first conductivity type comprises a highly doped region of the first conductivity type that contacts the first contact.

20. The semiconductor component of claim 17, further comprising a first metallization that contacts the first contact, the first metallization being on a first main surface of the substrate.

21. The semiconductor component of claim 20, further comprising a second metallization that contacts the second contact, the second metallization being on a second main surface of the substrate.

22. The semiconductor component of claim 21, wherein the first main surface and the second main surface are on opposing sides of the substrate.

23. The semiconductor component of claim 17, wherein the second contact contacts the second region.

24. The semiconductor component of claim 12, wherein the p-n junction is at a junction of the first region and the second region.

25. The semiconductor component of claim 12, wherein the first conductivity type is type N and the second conductivity type is type P.

26. The semiconductor component of claim 12, wherein the semiconductor component comprises a diode.

27. The semiconductor component of claim 26, wherein the semiconductor component comprises a plurality of diodes in the substrate.

28. The semiconductor component of claim 27, wherein at least two of the plurality of diodes are connected in parallel or series.

29. The semiconductor component of claim 12, wherein the semiconductor component comprises at least four p-n junctions, wherein each of the four p-n junctions is along a surface that extends through the substrate, wherein the surface has a cross section with a wavy shape.

30. The semiconductor component of claim 29, wherein the semiconductor component comprises at least nine p-n junctions, wherein each of the nine p-n junctions is along a surface that extends through the substrate, wherein the surface has a cross section with a wavy shape.

31. The semiconductor component of claim 30, wherein the semiconductor component comprises at least sixteen p-n junctions, wherein each of the sixteen p-n junctions is along a surface that extends through the substrate, wherein the surface has a cross section with a wavy shape.

32. The semiconductor component of claim 12, wherein the cross section comprises a closed curve with a wavy shape.

33. A semiconductor component in which active junctions extend along at least one surface that is perpendicular to main surfaces of a semiconductor chip and substantially across an entire thickness thereof, said at least one surface having a cross-section parallel to the main surfaces, wherein the cross-section has a regularly undulating curve shape.

34. The semiconductor component of claim 33, wherein said undulating curve is a curve of Sierpinksi curve type.

35. The semiconductor component of claim 33, wherein contacts with regions to be connected are made by conductive fingers perpendicular to the main surfaces of the semiconductor chip and substantially crossing an entire region with which a contact is desired to be established.

36. The semiconductor component of claim 35, wherein the conductive fingers are metal fingers.

37. The semiconductor component of claim 35, wherein at least one of the conductive fingers is solid, wherein at least a portion of at least one of the conductive fingers contacts a most external semiconductor layer.

38. The semiconductor component of claim 33, wherein the semiconductor component is of multicellular type, and the junctions are formed of several surfaces perpendicular to the main substrate surfaces.

39. A diode according to claim 38, formed in an N-type semiconductor substrate, wherein the conductive fingers penetrating into the N-type regions are surrounded with heavily-doped N-type regions.

40. A diode according to claim 33, comprising a central conductive finger extending across the entire substrate thickness surrounded with a region of a first conductivity type and with a region of a second conductivity type, a contact being taken back at the periphery of the region of the second conductivity type by at least one peripheral conductive finger, the central conductive finger being connected to a first metallization extending over an entire substrate surface, and said at least one peripheral conductive finger being connected to a metallization on the other substrate surface.

41. The semiconductor component of claim 33, wherein the curve is a closed curve.

* * * * *